United States Patent [19]

Makabe et al.

[11] Patent Number: 4,945,551
[45] Date of Patent: Jul. 31, 1990

[54] SOFT X-RAY LITHOGRAPHIC SYSTEM

[75] Inventors: Hideki Makabe; Kenji Iwahashi, both of Kyoto, Japan

[73] Assignee: Shimadzu Corporation, Kyoto, Japan

[21] Appl. No.: 436,135

[22] Filed: Nov. 14, 1989

Related U.S. Application Data

[63] Continuation of Ser. No. 44,251, Mar. 11, 1987, abandoned.

[30] Foreign Application Priority Data

Jul. 19, 1985 [JP] Japan .................. 60-160785

[51] Int. Cl.$^5$ ............................................. G21K 5/00
[52] U.S. Cl. ................................... 378/34; 378/145
[58] Field of Search ................ 378/34, 35, 84, 85, 378/145

[56] References Cited

U.S. PATENT DOCUMENTS

| | | | |
|---|---|---|---|
| 4,411,013 | 10/1983 | Takasu et al. | 378/34 |
| 4,693,933 | 9/1987 | Keem et al. | 378/84 |

FOREIGN PATENT DOCUMENTS

| | | |
|---|---|---|
| 0048174 | 4/1979 | Japan ........................... 378/34 |
| 56-121 | 1/1981 | Japan . |
| 56-181 | 1/1981 | Japan . |
| 56-1840 | 1/1981 | Japan . |
| 56-23861 | 2/1981 | Japan . |
| 56-23873 | 2/1981 | Japan . |
| 56-25073 | 2/1981 | Japan . |

OTHER PUBLICATIONS

"Ultrafine Line Projection System", by Feder et al., IBM Tech. Disclosure Bulletin, vol. 16, No. 9, 2-1974.
"X-ray Zone Plates Fabricated Using e$^-$ Beam & X-ray Lithography", by Shaver et al., J. Vac. Sci. Tech. 16(6), Nov./Dec. 1979, pp. 1626–1630.
"The Renaissance of X-Ray Optics", by Underwood et al., Physics Today, Apr. 1984, pp. 44–52.
"Recent Developments Towards High Resolution X-Ray Imaging", by Spiller, Nuclear Inst. & Methods, vol. 177, 11-1980, 378-84, No. 1, pp. 187–192.
Kobe, Demagnified Projection Printing by a New X-Ray Lithographic System Using No Thin-Film Patter Masks, Aug. 1984.

*Primary Examiner*—Craig E. Church
*Assistant Examiner*—John C. Freeman
*Attorney, Agent, or Firm*—Armstrong, Nikaido, Marmelstein, Kubovcik & Murray

[57] ABSTRACT

A soft X-ray lithographic system for making a reduced copy of a pattern is described. The system contains a source of soft X-rays, a spherical concave reflector which convergently projects the soft X-rays from the emitting means through a pattern to be copied and a Fresnel zone plate which focuses and reduces the beam of soft X-rays convergently projected through the pattern.

5 Claims, 1 Drawing Sheet

SOFT X-RAY LITHOGRAPHIC SYSTEM

This application is a continuation of application Ser. No. 044,251 filed Mar. 11, 1987 now abandoned.

TECHNICAL FIELD

This invention relates to a lithographic system for soft X-rays using a Fresnel zone plate (hereinbelow abbreviated to FZP). More particularly, it relates to a lithographic system for forming a reduced image from a densely drawn planar pattern by transmission of soft X-rays and beam condensation using a FZP.

BACKGROUND ART

The formation of IC (integrated circuits) patterns onto a target wafer in the semiconductor industry has been achieved mainly by optical reduction exposure using a light beam and optical lens system. Conventional photo-lithography has reached its physical limit because of unavoidable wave length related diffraction phenomena. Soft X-ray lithography is expected to overcome this limitation because X-rays have much shorter wave lengths.

A suitable imaging system for X-ray lithography having reductive or scale-down potential is not presently available. The process currently used in this art is the so called proximity exposure, process which will reproduce only an equi-dimensional copy of an original, for instance, a mask pattern. It is not possible to obtain a reduced copy, and the minimum line width to be transcripted from an original, or from a mask pattern, can not be finer than the width of the original.

DISCLOSURE OF THE INVENTION

This invention is intended to advance the conventional art as noted and to adapt the reductive projection system which has been used successfully in photo-lithography so that it can be used in soft X-ray lithography.

The imaging system of the present invention essentially comprises a soft X-ray source, which is emissive like a point source, a mask pattern or an original to be transcripted, and a spherically concave reflector to converge efficiently soft X-rays onto a FZP, which is for focusing X-rays onto a resist plate or a target material. These components will be illustrated in the drawings and explained in detail hereinbelow.

It is known to use a Fresnel zone plate (FZP) as an imaging element without use of a lens. High performace FZP systems have recently become available by application of holographic or electron beam technology.

The basic concept of making a FZP by holography is illustrated in FIG. 3. Assuming a spherical wave diverging from P1 and another spherical wave converging to P2 and, a FZP pattern recorded at the middle between P1 and P2, this FZP will function as a lens having an f= a/2 with respect to the recording light (wave length assumed to be 4000 angstroms). However the same FZP will function with respect to soft X-ray (wave length assumed to be 8 angstroms) as a lens having an f'=4000/8×f=500 f=250a. It follows that manufacture of a FZP having a focus distance =100 mm with soft X-rays having a wave length =8 angstroms makes a=0.4 mm, which is a covenient and practical size.

It should be noted here that attainment of a minimum resolvable width of W=0.2 micrometer requires, according to formula (1) which will appear hereinbelow, that the aperture size of the FZP should be 0.49 mm, a size which is feasible by holographic technology.

In a recommended method for manufacture of the FZP, a substrate plate 11 capable of transmitting soft X-rays is coated with gold(Au) 12 to a suitable thickness. A photoresist material is coated over the coating of gold. Then, a target pattern of the FZP which is to be copied is recorded onto the Au surface by a known ion etching process complete the FZP. If a substrate capable of transmitting soft X-rays is not available, and a free-standing zone plate structure having a support frame may be prepared.

The FZP thus obtained is characterized by a series of concentric circles wherein the spacing between the outermost circles is equal to the width W, and the spacings between the circles become larger going toward the center of the FZP. The embodiments, described hereinbelow, employ a FZP thus obtained.

The spherically concave reflector for soft X-rays, a major component of the system of the invention, may be fabricated by stepwise sputtering onto a reflector substrate 15 successive layers of carbon 16 and tungsten 17, each layer several angstroms thicks to build up 15 or 16 layers.

With regard to optical analysis of a system comprising the FZP, the reflector and soft X-ray with respect to projecting a perodic line and space pattern, it is assumed by analogy with an optical lens that the F number (focal ratio to aperture) of the lens is denoted by F and the wave length by λ(lamda). The minimum resolvable line and spacing (resolution width) is;

$$W = 1.22 F \lambda \tag{1}$$

Comparing the F number required with visible light of 400 nm with that required for of 8 angstrom soft X-rays with reference to the same resolvtion width the, F number of the soft X-rays can be 500 times greater than with visible light. This suggests that the FZP may be of extremely small diameter for the X-rays. Therefore, should the resolution requirement be made more stringent by one tenth, the F number may be increased 50 times, which proves that employment of soft X-rays enables attainment of exceedingly high level of resolution.

In this invention, the X-rays are concave by a concaved reflector onto the FZP, which brings about high utilization of the X-rays. An alternative method of imaging using a concave mirror for reflection can be employed. However, mirror is required to have a finished accuracy of more than ⅛ wave length, which means that the mirror surface should be finished to be more than 1 angstrom when using X-rays having a wavelength of about 8 angstroms.

MODE(S) FOR CARRYING OUT THE INVENTION

Figure 1:
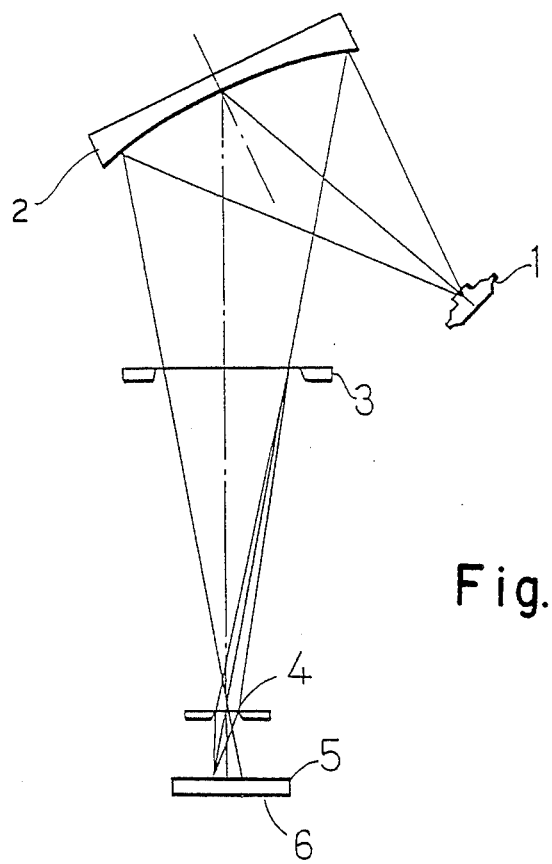
FIG. 1 is a not-to-scale perspective view of the components in the system of the present invention.

In FIG. 1, 1 is an X-ray source, 2 is a spherically concave reflector for soft X-rays, 4 is a FZP, and 3 is an original or mask pattern placed at a suitable position between the reflector 2 and the FZP 4. Also in FIG. 1, 6 is a target substrate to copy an IC pattern and lying thereon is a photoresist 5. In the above arrangement, the reflector 2 is disposed to project an image of the emitting zone of the source 1 onto the surface of the FZP 4, which is located at a point where the beam of X-rays passing through the pattern is converged.

For illustration, reference is made to an example when the IC pattern lying on a 5 mm square chip is scaled down one fifth by simultaneous exposure.

As soft X-rays, a wave length 8.34 angstroms is obtained by use of the characteristic aluminum K $\alpha$(alpha) line.

Assuming that a focal distance of f=100 mm, attainment of a resolution width W=0.2 micrometer requires, according to formula (1), that is W=1.22×(F number of the FZP)×$\lambda$ and that the FZP should have a diameter=0.51 mm.

Further, the distance between the FZP 4 and the resist surface 5 is assumed to be 120 mm, for instance, which follows that the distance between the FZP 4 and the mask pattern 3 should be 600 mm. And a required size of the mask pattern is 25 mm square to which the reflector is set of as to irradiate the pattern uniformly and produce an image of the X-ray source.

INDUSTRIAL APPLICABILITY

As is illustrated above, a copying target having minimum line width of 0.2 micrometer requires only that the lines on a mask pattern be 1 micrometer simplifying manufacture of the mask pattern.

Figure 2:
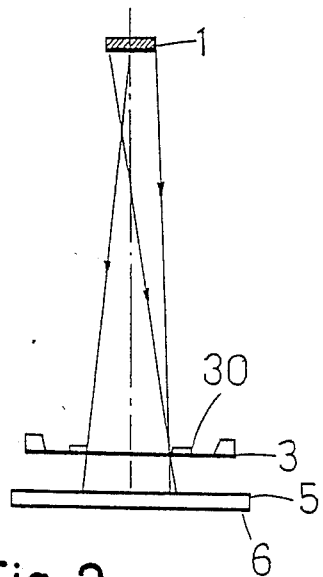
FIG. 2 is to shows a conventional proximity exposure process (not according to the invention).

In the case of the conventional proximity process illustrated in FIG. 2, emitting X-rays, if not completely parallel, will diffract into the underside of the pattern 3, and the X-ray source, if not close to a point source, may blur the periphery of the pattern. Therefore, when using an X-ray tube, it is necessary that the source 1 be as remate as possible from the mask 3, and that the electron beam be aimed to the target with as narrow an aperture as possible. A revolving anode and a further lead to obtain light as Synchrotron Orbit Radiation an ideal light source may be necessary. In contrast to the conventional approach, the system of the present invention is freed from such restrictions.

In addition, the method of reductive projection upon which the present invention is based, is advantageous in its apparatus aspects. For instance, mechanisms for controlling interval between the resist and the mask pattern and for accurate positioning thereof, and prevention of influence by heat.

The present invention has been explained by application to the copying of an IC pattern. However, it can be applied to microscopic engineering to observe living cells.

We claim:

1. A soft X-ray lithographic system for making a reduced copy of a patttern comprising:
   (a) means for emitting a beam of soft X-rays;
   (b) a spherical concave reflector, which convergently projects the beam of soft X-rays from the emitting means through a pattern to be copied; and
   (c) a Fresnel zone plate, located at a point where the beam of soft X-rays convergently through the pattern to be copied is converged, which focuses the bean of soft X-rays convergently projected through the pattern onto a resist.

2. A soft X-ray lithographic system as defined in claim 1, wherein the Fresnel zone plate comprises a substrate plate capable of transmitting soft X-rays coated with a layer of gold having a concentric circular pattern recorded thereon.

3. A soft X-ray lithographic system as defined in claim 1, wherein the Fresnel zone plate comprises a series of concentric circles, the spacing between the outermost circles being equal to the resolvable width of the Fresnel zone plate and the spacings becoming larger going toward the center of the plate.

4. A soft X-ray lithographic system as defined in claim 1, wherein the spherically concave reflector for the soft X-rays comprises successive layers of carbon and tungsten on a substrate.

5. A soft X-ray lithographic system as defined in claim 4, comprising 15 or 16 successive layers of carbon and tungsten.

* * * * *

UNITED STATES PATENT AND TRADEMARK OFFICE
CERTIFICATE OF CORRECTION

PATENT NO. : 4,945,551

DATED : July 31, 1990

INVENTOR(S) : MAKABE et al.

Figure 3:
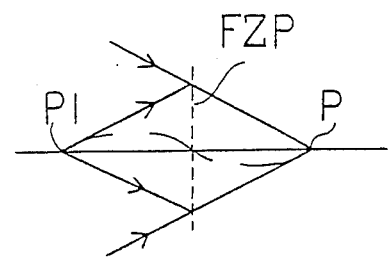
FIG. 3 shows the basic concept of manufacture of a FZP by holography.
Figure 3:
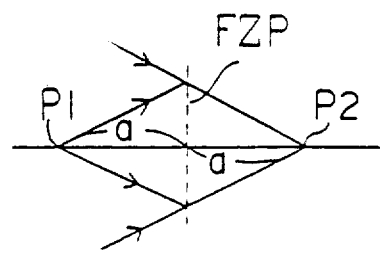
Figure 4:
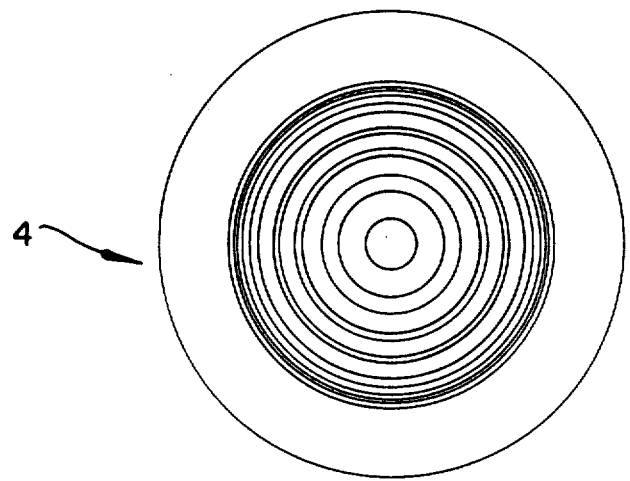
FIG. 4 is an enlarged side view of the Fresnel zone plate shown in FIG. 1.
Figure 5:
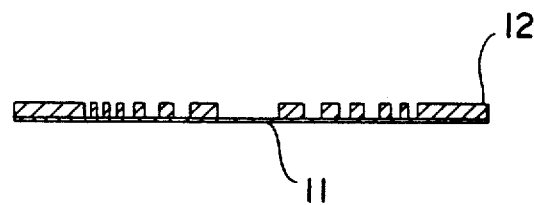
FIG. 5 is a sectional view of the Fresnel zone plate of FIG. 4.
Figure 6:
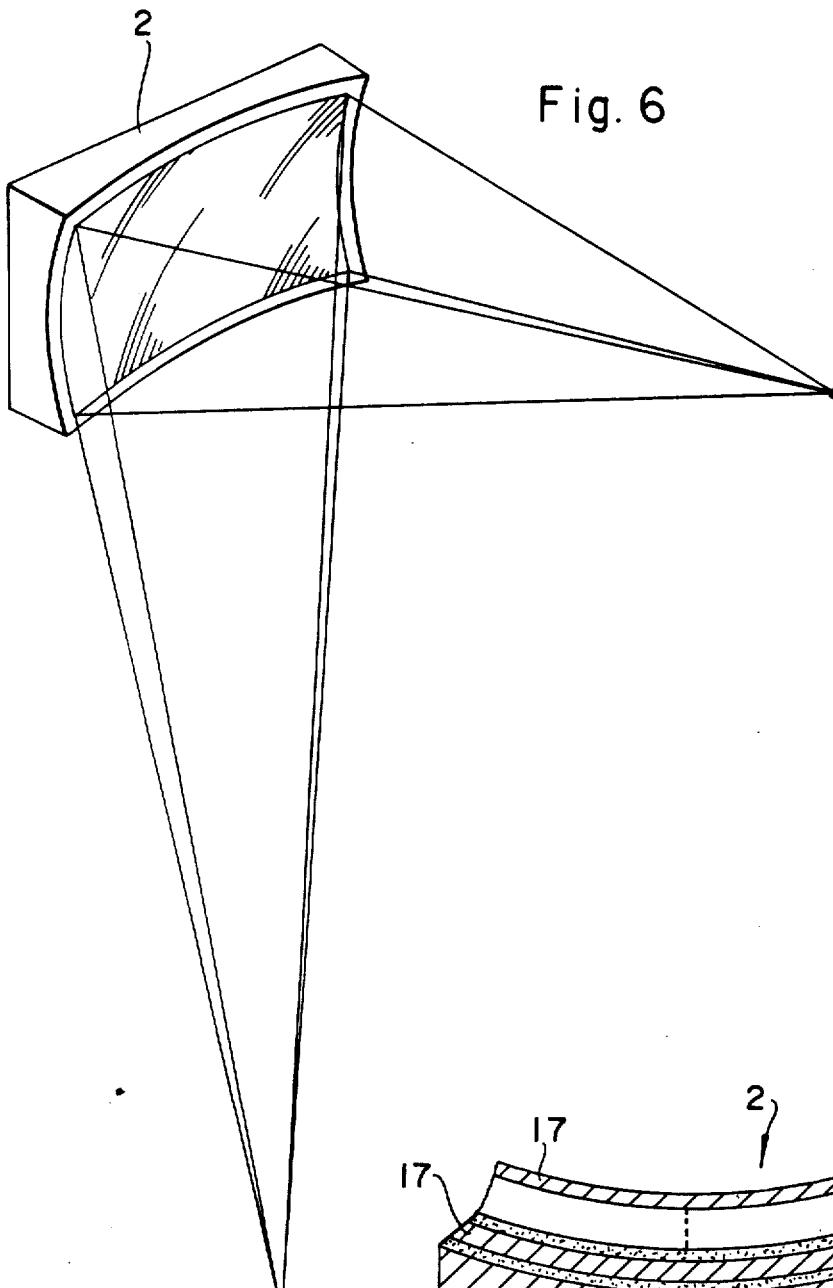
FIG. 6 is an enlarged perspective view of the spherical concave reflector shown in FIG. 1.
Figure 7:
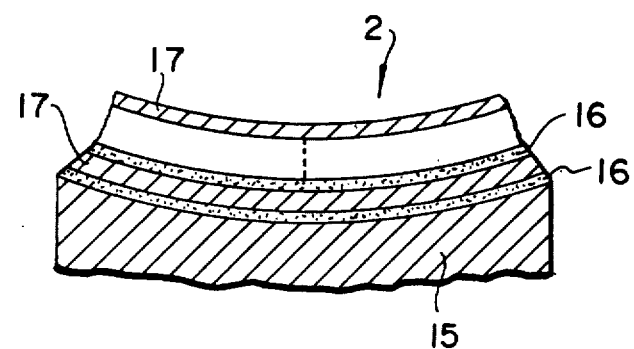
FIG. 7 is a sectional view of the reflector shown in FIG. 6. These drawings are presented by way of illustration and therefore these should not be construed as limiting the invention.

It is certified that error appears in the above-identified patent and that said Letters Patent is hereby corrected as shown below:

In the drawings, delete Fig. 3 and substitute therefor Fig. 3, as shown on the attached page.

In the drawings, add Figs. 4, 5, 6, and 7, as shown on the attached pages.

Signed and Sealed this

Eighth Day of December, 1992

Attest:

DOUGLAS B. COMER

*Attesting Officer*   Acting Commissioner of Patents and Trademarks